US007002668B2

(12) United States Patent
Rivin

(10) Patent No.: US 7,002,668 B2
(45) Date of Patent: Feb. 21, 2006

(54) STAGE POSITIONING UNIT FOR PHOTO LITHOGRAPHY TOOL AND FOR THE LIKE

(76) Inventor: Eugeny I. Rivin, 4227 Foxpointe Dr., West Bloomfield, MI (US) 48323

( * ) Notice: Subject to any disclaimer, the term of this patent is extended or adjusted under 35 U.S.C. 154(b) by 0 days.

(21) Appl. No.: 10/378,512

(22) Filed: Mar. 3, 2003

(65) Prior Publication Data

US 2005/0236908 A1    Oct. 27, 2005

Related U.S. Application Data

(60) Provisional application No. 60/362,880, filed on Mar. 8, 2002.

(51) Int. Cl.
  G03B 27/58    (2006.01)
  G03B 27/62    (2006.01)
  G03B 27/42    (2006.01)

(52) U.S. Cl. .............................. 355/72; 355/75; 355/53

(58) Field of Classification Search .................... None
See application file for complete search history.

(56) References Cited

U.S. PATENT DOCUMENTS 5,969,441 A * 10/1999 Loopstra et al. .............. 310/12

* cited by examiner

*Primary Examiner*—Peter B. Kim
(74) *Attorney, Agent, or Firm*—Gifford Krass

(57) ABSTRACT

A photolithography tool, e.g. for microelectronics production, having the stage units (both mask and substrate stage units) composed of two identical stage assemblies which are simultaneously driven with the programmed production motions. The acceleration time histories of the stage assemblies within the unit are identical but opposite in direction. Thus, the photolithography tool processes two substrates simultaneously while being free from objectionable dynamic loads and from shifts of its center of mass.

4 Claims, 5 Drawing Sheets

Stage Positioning Unit for Photo Lithography Tool and for the Like

STAGE POSITIONING UNIT FOR PHOTO LITHOGRAPHY TOOL AND FOR THE LIKE

Priority date for this Application is requested to be the filing date (Mar. 8, 2002) of the Provisional Patent Application 60/362,880 for "Photo Lithography Apparatus".

FIELD OF THE INVENTION

The present invention relates to movable stage units for use with photo lithography and other semiconductor printing apparatuses, machine tools, microscopes or the like. In particular, it relates to movable stage units requiring high speed/high acceleration/high accuracy programmed motions in positioning vibration sensitive systems.

BACKGROUND OF THE INVENTION

A photolithography tool for printing semiconductor integrated circuits is a typical representative of high precision production equipment. On the one hand, positioning accuracies for the stages carrying the mask and the object (wafer) carrying multiple images of the printed circuits are measured in nanometers (nm), but on the other hand, the productivity requirements call for very high velocities and accelerations of movements of the massive stages and for short settling times after the movements terminate (stop).

The photolithography tools have extremely complex structures comprising the stage units, their driving motors, intricate and high precision illumination and focusing systems, and numerous precision sensing and measuring devices (usually, interferometers). A typical stage unit comprises the stage proper supporting the object (substrate) or the mask (reticle), stage frame or base plate supporting the stage motion, and other components supporting ancillary and corrective movements and/or measuring devices. As a result, the structures have many joints and cannot be made very stiff, thus resulting in high sensitivity to vibrations, e.g. see E. I. Rivin, *Passive Vibration Isolation*, ASME Press, 2003. To reduce damaging effects of the inevitable external vibrations on the precision semiconductor devices, extremely stringent and expensive to satisfy requirements to vibration levels of the floors and other supporting structures for the photolithography tools are mandated. The allowable vibration amplitudes of the floor are in fractions of one micrometer (~0.01–0.12 μm or 10–120 nm), e.g. see the above cited book.

The above two paragraphs reveal a design contradiction which is critical both for designing and for using the high precision photolithography tools and the like: Advancement of the integrated circuit technology requires reducing the line widths (already counted in nanometers), thus increasing sensitivity of the tools to external vibrations, while productivity enhancement requirements call for intensification of the positioning process of the stages, thus for higher programmed accelerations and, consequently, greater dynamic loads generated within the tool itself and creating dynamic (inertia) forces causing very intense vibrations, far exceeding vibrations transmitted from the floor. The dynamic forces are further intensified by the trend for increasing the wafer size (e.g., from 200 mm to 300 mm) which leads to increasing sizes and masses of the object stages. The dynamic force amplitudes exceeding 1 KN are quoted in Kwan, Y. B. P., Loopstra, E. L., *"Nullifying Acceleration Forces in Nano-Positioning Stages for Sub- 0.1 μm Lithography Tool for 300 mm Wafers,"* in Proceed of the 15$^{th}$ Annual Meeting of ASPE, 2000, pp. 525–528.

One way of protecting the sensitive photolithography tools and similar structures from such intense dynamic loads can be achieved by using so-called force or reaction frames, e.g. as described in U.S. Pat. Nos. 5,260,580 and 6,271,640. These patents teach attachment of stationary parts of the stage-driving linear motors to a structure rigidly mounted on the floor or on other supporting structure. If there are several motors driving a particular stage, the stator of the primary motor performing the relatively long stroke/high acceleration programmed movement of the stage (rather than of the motors providing much slower small stroke correction movements associated with low accelerations and dynamic inertia forces) is attached to the reaction frame. The first (moving) part of the primary motor is connected to the driven stage which is, in its turn, connected to the tool structure (so-called metrology frame) via pressurized fluid (usually, air) bearings or guides having extremely low friction. The tool structure is dynamically isolated directly from the reaction frame and/or from the floor to which the reaction frame is mounted by low stiffness vibration isolators. As a result, the high dynamic forces do not noticeably disturb the precision metrology frame. While the metrology frame is isolated from the intense dynamic forces, the complexity of the apparatus is increased by addition of massive and bulky force frame which has to be precisely aligned with the metrology frame. Transmission of the intense reaction force to the floor excites floor vibrations which are undesirable not only for the tool to which the reaction frame belongs, even with vibration isolators, but also to other equipment units mounted on the floor. To alleviate this effect, extremely high stiffness of the floor is specified, in the range of $1-2.5\times10^5$ N/mm. Needless to say, such floors are extremely expensive. Another shortcoming of this approach is the fact that the relatively long stroke movements of the massive stage unit cause shifts of the center of mass of the metrology frame and subsequent undesirable tilting of the metrology frame. Compensation of the tilting in the system with the reaction frame requires a sophisticated and expensive servo-controlled system, e.g. as described in U.S. Pat. No. 5,844,666.

Another approach to reducing dynamic forces acting on the metrology frame and caused by acceleration/deceleration of the stage is described in U.S. Pat. No. 6,449,030 to Kwan and shown in FIG. 1 (the Prior Art) with self-explanatory labels from the above cited article by Kwan, et al. Long-stroke (pre-programmed) "LoS" motion of the reticle stage having mass $m_f$ (labeled "LoS Frame" in FIG. 1) in the direction of arrow is accompanied by the motions in the opposite direction (shown by arrows) of Balance Masses 1 (mass $m_{b1}$) and 2 (mass $m_{b2}$) separated from the stage by low-friction LoS X and LoS Z Bearings. Two LoS Y Actuators (linear motors) have coils on the stage and magnets on the Balance Masses, thus applying equal but opposite forces to the stage and to the Balance Masses. Acceleration/velocity time histories of the Balance Masses may be different from those of the stage and from each other depending on ratios $m_f/m_{b1}$, $m_f/m_{b2}$, $m_{b2}/m_{b1}$. This approach does not require the reaction frame since the dynamic forces cancel out within the system. Also, the center of mass remains essentially stationary with possibly minor deviations due to variations of friction forces in the multiple bearings. One disadvantage of this approach is its design complexity and, consequently, high costs. There is a need for two precisely machined balance masses and for supporting surfaces for them on the machine frame, for numerous bearings, and for a complicated alignment procedure between the stage, the balance masses, and the machine frame. The correction short-stroke (SS) motions of the reticle table, effected by SS X-, SS Y-, and SS Z-actuators, are not balanced.

U.S. Pat. No. 5,815,246 discloses a system having a first balance mass performing translational motions and a second balance mass performing rotational motion and driven by a rotation motor. This concept is also characterized by excessive design complexity.

International Patent WO 98/28665 to Loopstra, et al, discloses a balancing system for two stages simultaneously, one stage in the operating position and another stage residing on the measuring station This system is characterized by one large balance mass providing balancing action for both X and Y motions of both stages (X and Y being coordinate directions in the horizontal plane and perpendicular to the vertical Z axis). However, since the two stages have different motion histories, the residual dynamic forces may still have harmful effects. Also, the center of mass may shift in this system and the resulting tilting of the tool is not fully compensated.

These and other disadvantages are addressed and overcome by the present invention.

Although specific references are made in this Specification to the photolithography apparatus (tool) for manufacturing of integrated circuits, it should be understood that the like apparatuses may have many other applications. They may be employed in manufacturing of integrated optical systems, magnetic domain memory systems, liquid crystal display panels, thin-film magnetic heads, etc. Accordingly, the use in the text of such specific terms as "reticle", "wafer", etc. should be considered as representing more general terms such as "mask", "substrate", etc. The terms "radiation" and "beam" are representing all types of electromagnetic radiation or particle streams such as, but not limited to, ultraviolet, X-rays, electrons, and ions.

SUMMARY OF THE INVENTION

It is an object of the present invention to provide for cancellation of dynamic forces generated in the process of acceleration/deceleration of the stage while not significantly complicating the design of the apparatus.

Another object of the present invention is to provide a high precision photo lithography apparatus and the like which simultaneously processes two objects (substrates) while having less complexity, being less costly to manufacture, and requiring less space than two apparatuses of conventional designs, each processing one object.

According to a first aspect of the present invention, the balancing mass to the stage assembly is embodied as a second stage assembly suitable for processing another object or carrying another mask, in addition to the first stage unit, thus realizing a self-balancing effect for up to two linear and one angular motions. The motions of the "balancing" stage assembly are to be executed in such a way that they have the same pre-programmed parameters (displacements, velocities, but especially accelerations and their time histories) as but oppositely directed to the movements of the first stage assembly.

According to another aspect of the present invention, the photolithography apparatus has self-balancing arrangements for both the mask and the substrate stages.

According to yet another aspect of the present invention, each of the production units (a production unit being a set of interacting mask and substrate stages) is associated with an appropriate optical projection system.

According to a further aspect of the present invention, the two-object photo lithography apparatus/tool has only one illumination unit providing radiation energy to each projection system via appropriate optical conduits/waveguides.

Further objects of the present invention will become apparent from the description of the preferred embodiments which follows.

DESCRIPTION OF THE PREFERRED EMBODIMENTS

Preferred embodiments of the present invention are described with reference to the drawings.

Figure 2:
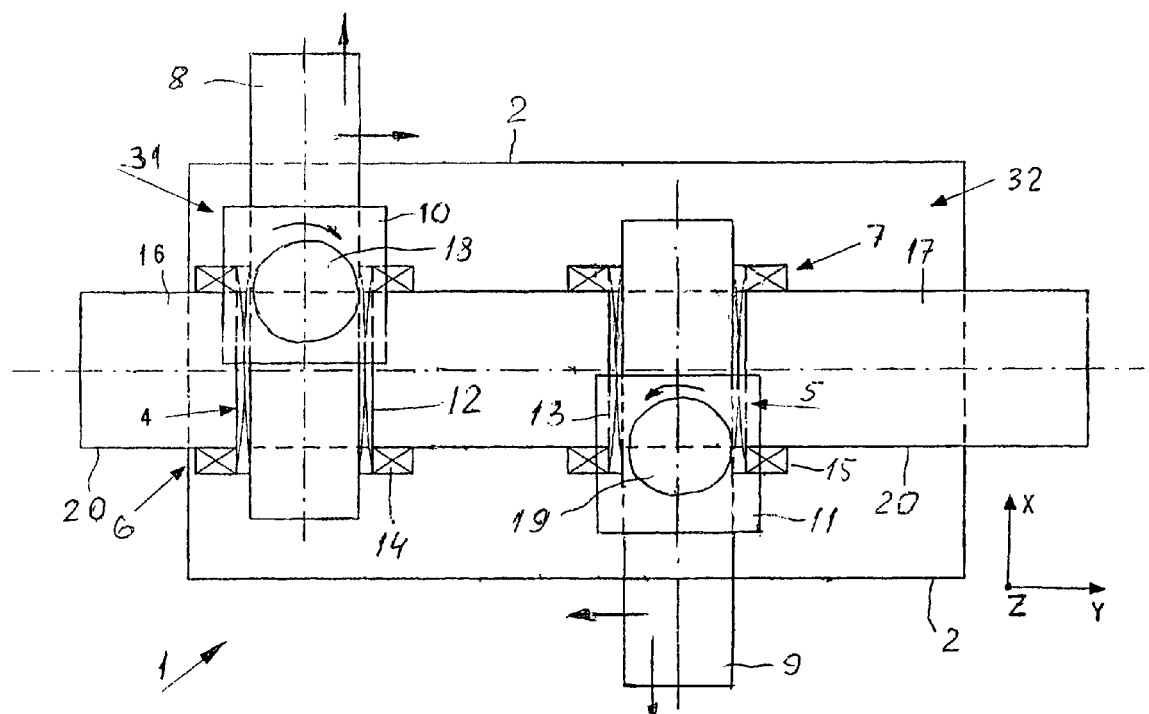
FIG. 2 is a diagrammatic top view of one embodiment of the substrate stage unit according to the present invention wherein the stage and the balancing mass are driven by separate linear motors.

FIG. 2 is a diagrammatic top view of one embodiment of the substrate stage unit 1 of a photolithography tool according to the present invention. While the schematic depiction in FIG. 2 has distorted dimensional features, such as distances between the stages in X- and Y-directions, FIG. 3 gives an axonometric depiction which is less schematic and provides more realistic dimensional correlations within the substrate stage unit.

The stage unit 1 is mounted on base plate 2 and comprises two stage assemblies 31 and 32. Each stage assembly is provided with an X-actuator (linear motor) 4, 5, respectively, and with a Y-actuator 6, 7, respectively. Preferably, the Y-direction is the direction of the travel of the stage assemblies 31, 32 with the greatest magnitudes of accelerations of the pre-programmed motions. The X-actuators 4, 5 are each provided with a first (moving) part 8, 9, respectively, which extends parallel to X-direction. The first parts 8 and 9 are fastened to substrate holders 10, 11 of the respective stage assemblies 31 and 32 and are displaceable relative to the second (stator) parts 12, 13, respectively, of the respective X-actuators 4, 5. The Y-actuators 6 and 7 are each provided with the first parts 14, 15, respectively, which are fastened to the second parts 12, 13, respectively, of the X-actuators 4, 5 of the respective stage assemblies 31 and 32 and are displaceable relative to second parts 16, 17 of the respective Y-actuators 6 and 7 which extend parallel to the Y-direction. The second parts 16 and 17 of the Y-actuators can be attached to or integrated with a straight guide 20 as shown in FIG. 2. In this embodiment, actuators 6 and 7 are essentially merged into one actuator (motor) with two movable first parts 14 and 15 and one stator (the second part) obtained by integrating the second parts 16 and 17 with the guide 20 serving both stage assemblies 31 and 32. It should be noted, that such integration is a design choice and two same-direction (e.g., Y-direction) actuators can be made independent. The pre-programmed external signals (electric currents) supplied to the X-actuators 4 and 5 and to the Y-actuators 6 and 7 (e.g., Lorentz force linear motors) determine the time histories of the forces applied to the stages as well as the reaction forces applied to the stators of the respective actuators.

The substrate holders 10 and 11 thus are each displaceable parallel to the X-direction by means of suitable driving forces of X-actuators 6, 7, respectively, of the respective stage assemblies 31, 32. Also, the substrate holders 10 and 11, each together with the X-direction actuator 6, 7 of the respective stage assembly 3, 4, are displaceable parallel to the Y-direction by means of suitable driving forces of the Y-actuators of the respective stage assemblies 31, 32.

Figure 3:
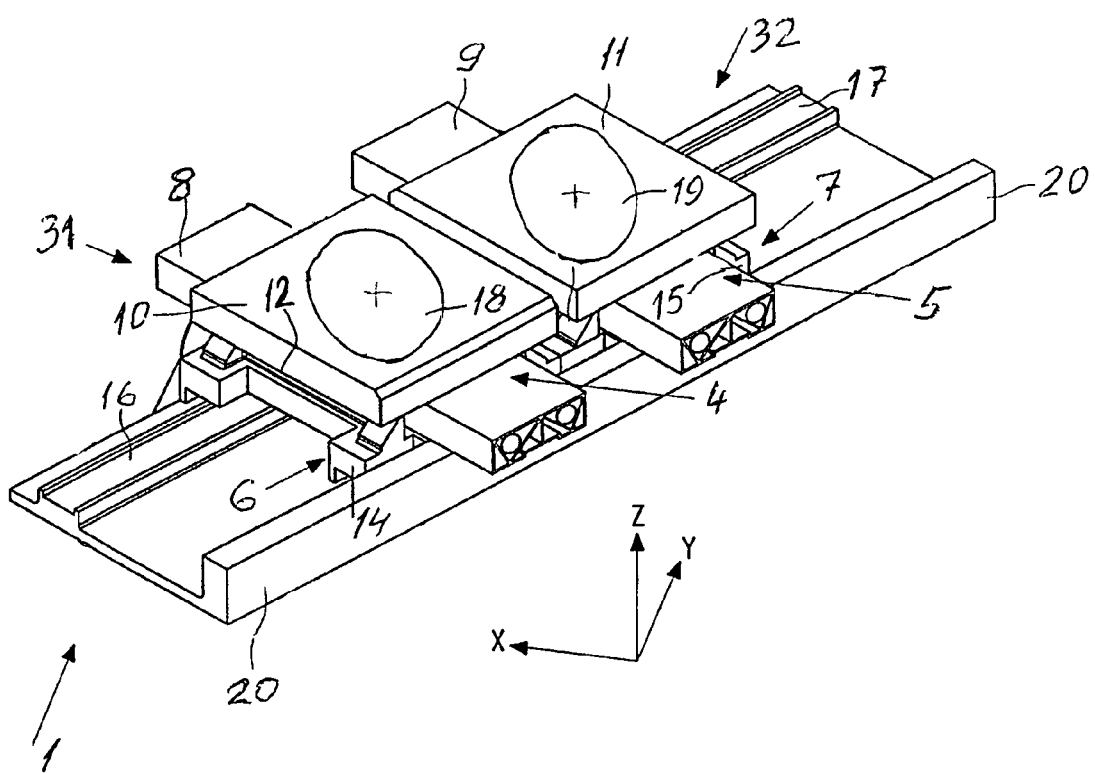
FIG. 3 gives an axonometric depiction of the top part of FIG. 2.

As FIGS. 2 and 3 further show, the Y-actuators 6 and 7 of the stage assemblies 31 and 32 are guided by a common straight guide 20 along which the first parts 14 and 15 of the Y-actuators 6 and 7 are movably guided parallel to Y-direction.

The stage assemblies may also comprise additional actuators (not shown) for driving the substrate holders 10 and 11 carrying substrates (wafers) 18, 19 in "yaw" directions (programmed or corrective rotational motions about axes parallel to the Z-axis), in Z-direction, and possibly for some other corrective motions of the substrate holder. The basic motions of the substrate holders 10 and 11, such as the scanning motion or repositioning the substrate to bring a next area for the exposure, etc., are pre-programmed. The corrective motions are driven in accordance with the input from high accuracy measuring devices (usually, interferometers), not shown in the FIGURES. The corrective motions are associated with much smaller accelerations (and reaction forces) than the basic (pre-programmed) motions.

Preferably, the stage assemblies 31 and 32 are identical in design and, especially, in their masses. The possible differences are minor, e.g. due to different wafers processed on different stage assemblies. According to the present invention, the basic (programmed) motions of two stage assemblies are performed in such a way that the accelerations, velocities, and displacements of the programmed X-direction, Y-direction, and yaw motions of two stage assemblies are directionally opposed to each other while having the same time histories. Directions of these motions are illustrated in FIG. 2 by arrows. Not all of these three motions (X-direction, Y-direction, and yaw) may be programmable in a given design embodiment. If the stage assemblies are identical and their driving motors are identical, the same time histories of the motions in the opposite directions are easily achieved by reversing polarities of the current supply into the respective motors, possibly with minor corrections of the currents by the motor control systems in order to correct variations (within the tolerance ranges) of the motor and the stage parameters.

The motion planning described in the above paragraph results in identical but oppositely directed reaction forces acting on the stators of the respective motors, e.g. X-direction motors, Y-direction motors, etc. Thus, these reaction forces are compensating (balancing) each other, providing elimination of the dynamic exertions on the vibration-sensitive photolithography tool as well as elimination of the center of mass shifts without a need for any additional (balancing, etc.) devices. Moreover, the costs of production of the wafers are somewhat reduced since two production systems are sharing the same structural parts, such as (but not only) the base plate 2 and guide 20 in FIG. 2, while such structural parts as the force/reaction frame and balance masses are eliminated.

The mask or reticle stage unit of a photolithography tool according to the present invention is designed similarly to the substrate stage unit 1 shown in FIG. 2, but possibly comprising a smaller number of actuators.

Figure 4:
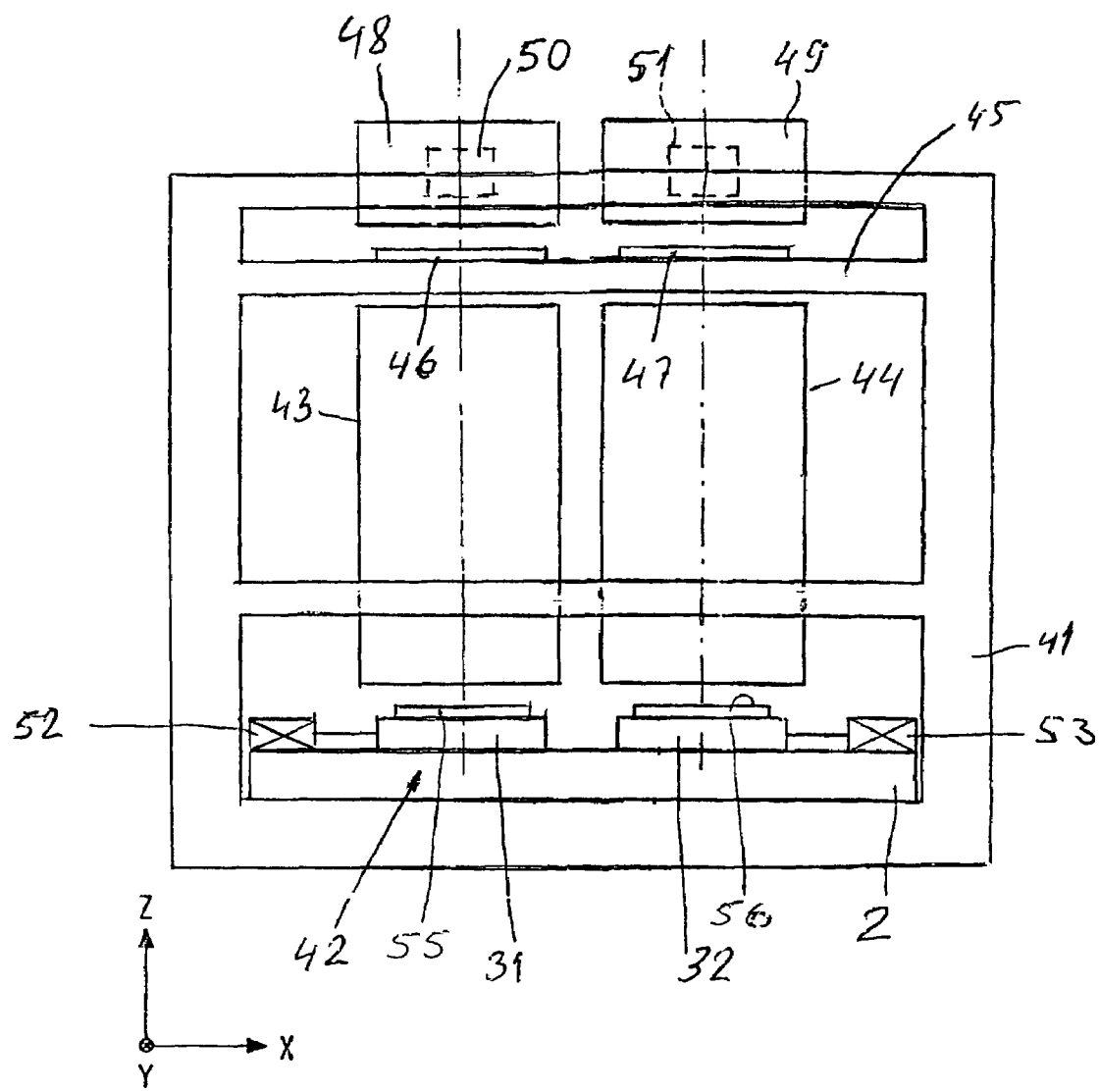
FIG. 4 is a diagrammatic representation of the lithographic tool simultaneously processing two substrates according to the present invention and having separate illumination and focusing systems for each substrate.

One embodiment of the complete photolithography tool per the present invention is shown diagrammatically in FIG. 4. This tool is provided with a frame 41 which supports, in that order as seen parallel to a vertical Z-direction, a positioning device (substrate stage unit) 42 comprising two stage assemblies 31 and 32 carrying substrate tables 55 and 56; two focusing units 43 and 44 for stage assemblies 31 and 32, respectively; a mask holder 45 carrying two mask stage assemblies 46 and 47 corresponding to substrate stage assemblies 31 and 32, respectively; and radiation sources 48 and 49 comprising light sources 50 and 51. Linear motors 52 and 53 (diagrammatically shown) are driving substrate stage assemblies in the X-direction.

Figure 5:
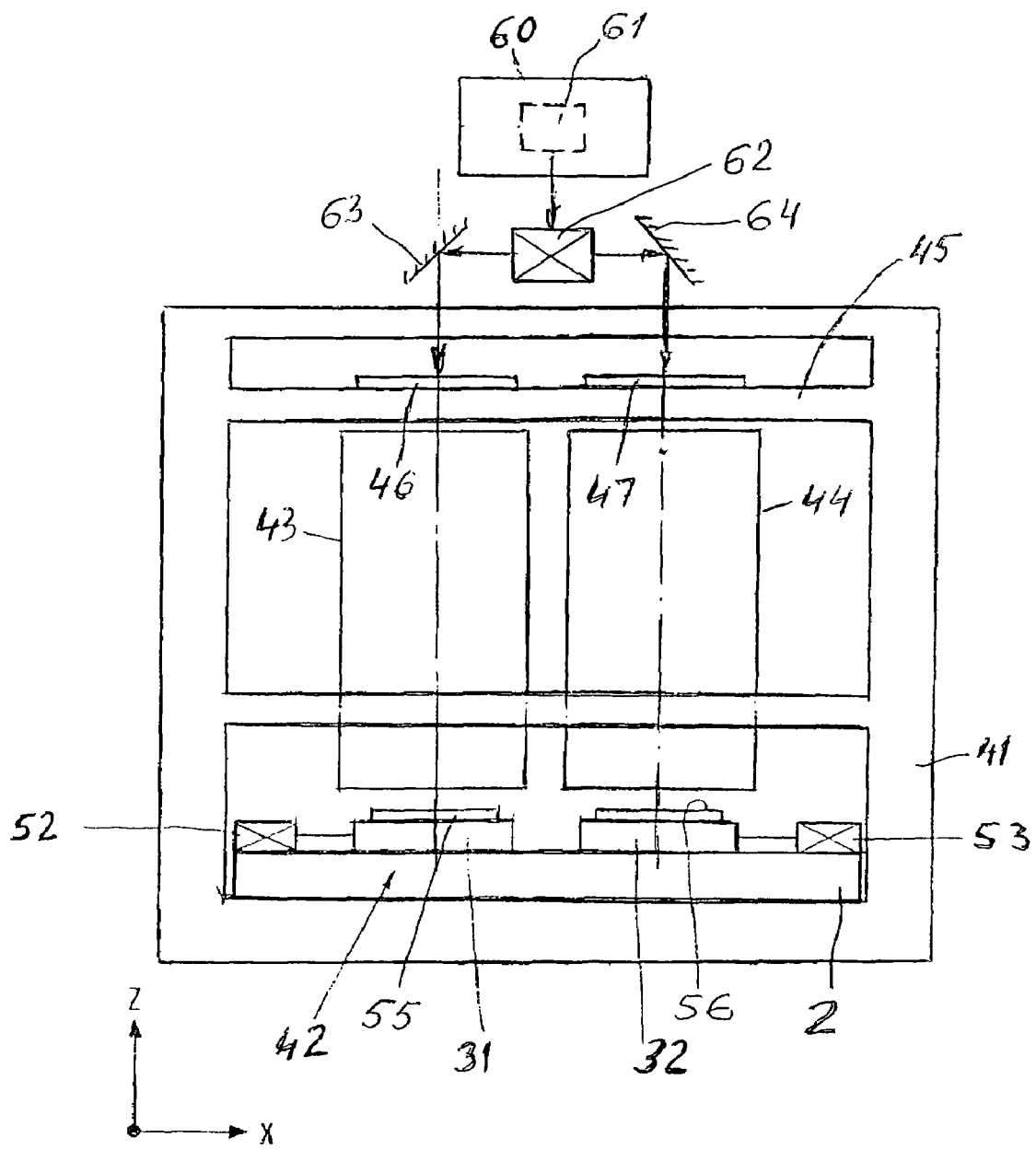
FIG. 5 is a diagrammatic representation of the lithographic tool simultaneously processing two substrates according to the present invention and having separate focusing systems for each substrate but a single illumination system.

Another embodiment of the photolithography tool per the present invention is shown diagrammatically in FIG. 5. While similar to the embodiment shown in FIG. 4, it has only one radiation source 60 comprising one light source 610f a greater intensity than the light sources 50 and 51 in the embodiment of FIG. 4. The radiation from the light source 60 is transmitted to focusing units 43 and 44 through a beam splitter 62 and mirrors 63 and 64. Obviously, the illumination beam can be split into two beams directed to the focusing units 43 and 44 by various means, such as but not only by a prism or by a fiber-optic system. The light source 60 as well as optical units 62, 63, 64 are positively attached to the frame 41 of the photolithography tool by known means (not shown).

Figure 1:
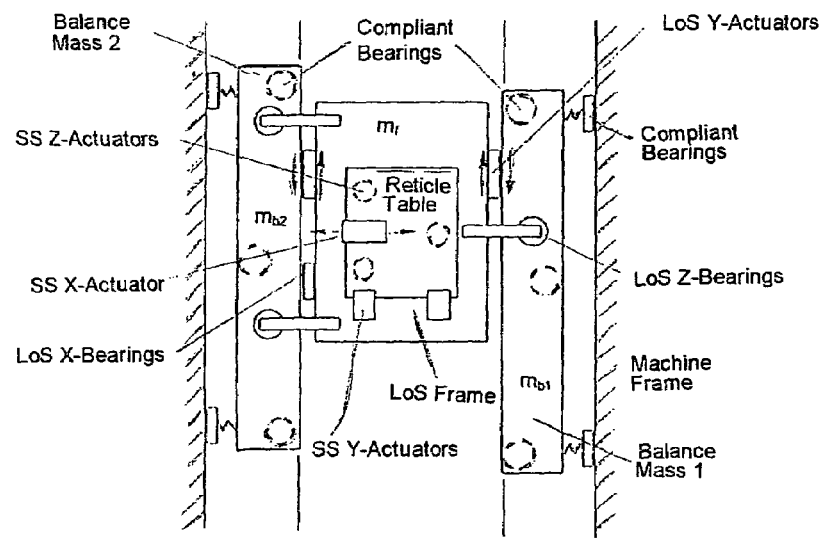
FIG. 1 is a schematic of a stage unit having balancing system comprising two balance masses (the Prior Art).

The described embodiments of the present invention differ from the Prior Art stage unit shown in FIG. 1 in at least the following ways:

(1) There are no special balancing units in the present invention, as compared with two balance masses, each having its bearings, in the Prior Art.

(2) The supporting part of the machine frame has a less complicated shape thus reducing manufacturing expenses.

(3) The described photolithography tool has a more compact architecture than the Prior Art and less structural components, thus the proposed two-position self-balancing photolithography tool has better benefit-to-cost and benefit-to-size ratios.

(4) Since the reaction forces associated with high intensity programmed motions of massive substrate and mask stages are cancelled inside the metrology frame, a less expensive vibration isolation system is required for the tool, thus further reducing the size and cost of the tool.

(5) The undesirable shifts of the center of mass of the tool are eliminated without adding complexity to the design.

It is readily apparent that the self-balanced stage units disclosed herein may take a variety of configurations. Thus, the embodiments and exemplifications shown and described herein are meant for illustrative purposes only and are not intended to limit the scope of the present invention, the true scope of which is limited solely by the claims appended thereto.

What is claimed is:

1. A stage unit comprising:
   two identical movable stage assemblies with the stage in each stage assembly performing a combination of pre-programmed and corrective motions, with said corrective motions being determined by deviations of the stages from the precise positions as detected by the sensing and measuring devices, wherein accelerations of the pre-programmed motions of the two stage assemblies in at least one coordinate direction have the same time histories but opposite directions.

2. A stage unit from claim 1, wherein each stage assembly is driven by identical actuators each having the first and the second parts, with said first parts of each actuator attached to and imparting motion onto the stage assembly.

3. A photolithography tool comprising:

two radiation sources for generating radiation for exposure of two substrates;

two optical means for irradiating two masks with radiation emitted from said radiation source to transfer mask patterns onto substrates to be exposed;

a mask stage unit comprising two movable mask stage assemblies for adjusting relative positional relationships between said masks and the respective substrates to be exposed;

two focusing units disposed between said masks and said respective substrates to be exposed;

a substrate stage unit comprising two movable stage assemblies, with each substrate stage assembly carrying a substrate exposed by light passing from the respective illumination source, through the respective optical means, through the respective mask, and through the respective focusing unit;

said movable mask stage assemblies and said movable substrate stage assemblies performing a combination of pre-programmed and corrective motions, with said corrective motions being determined by deviations of the stages from the pre-programmed precise positions as detected by the sensing and measuring devices, wherein the pre-programmed motions of the two mask stage assemblies have the same time histories but opposite directions, and the preprogrammed motions of the two substrate stage assemblies have the same time histories but opposite directions.

4. A photolithography tool of claim 2, wherein said two radiation sources are integrated into a single radiation source whose radiation is split into two identical beams radiating through said optical means for irradiating said masks.

* * * * *